United States Patent [19]

Sekiguchi

[11] E Re. 30,949

[45] Reissued May 25, 1982

[54] DIGITAL FREQUENCY DISPLAY DEVICE

[75] Inventor: Tadao Sekiguchi, Tokyo, Japan

[73] Assignee: Trio Kabushiki Kaisha, Tokyo, Japan

[21] Appl. No.: 119,664

[22] Filed: Feb. 8, 1980

Related U.S. Patent Documents

Reissue of:

[64] Patent No.: 4,114,101
Issued: Sep. 12, 1978
Appl. No.: 767,832
Filed: Feb. 11, 1977

[30] Foreign Application Priority Data

| | | | |
|---|---|---|---|
| Feb. 14, 1976 | [JP] | Japan | 51/15117 |
| Mar. 18, 1976 | [JP] | Japan | 51/29604 |
| Mar. 18, 1976 | [JP] | Japan | 51/29605 |
| Mar. 18, 1976 | [JP] | Japan | 51/32659[U] |

[51] Int. Cl.[3] ..... H04B 1/26

[52] U.S. Cl. ..... 455/158; 324/78 D; 324/78 F; 324/79 D

[58] Field of Search ..... 455/77, 120, 154–158; 331/64; 324/78 R, 78 D, 78 F, 79 R, 79 D

[56] References Cited

U.S. PATENT DOCUMENTS

| | | | |
|---|---|---|---|
| 3,938,048 | 2/1976 | Elliott | 455/157 |
| 4,061,980 | 12/1977 | Sato | 455/157 |
| 4,103,290 | 7/1978 | Sekiguchi | 324/78 D |
| 4,163,943 | 8/1979 | Miki et al. | 455/158 |
| 4,175,254 | 11/1979 | Manfreda | 324/78 D |

FOREIGN PATENT DOCUMENTS

| | | | |
|---|---|---|---|
| 2709456 | 9/1978 | Fed. Rep. of Germany | 455/158 |
| 2746186 | 4/1979 | Fed. Rep. of Germany | 455/158 |

*Primary Examiner*—Marc E. Bookbinder
*Attorney, Agent, or Firm*—Kenway & Jenney

[57] ABSTRACT

A digital frequency display device for digitally displaying the operating frequency of a communication apparatus comprising a reference frequency oscillator, a first frequency mixer for mixing the output frequencies of a first oscillator of the communication apparatus and of the reference frequency oscillator, a second frequency mixer for mixing the output frequency of a second oscillator of the communication apparatus and the resultant frequency provided from the first frequency mixer to produce the display frequency shifted by the reference frequency, and a frequency counter for counting the output frequency from the second frequency mixer and for correcting the shifted frequency component to display the correct frequency.

9 Claims, 5 Drawing Figures

DIGITAL FREQUENCY DISPLAY DEVICE

Matter enclosed in heavy brackets [ ] appears in the original patent but forms no part of this reissue specification; matter printed in italics indicates the additions made by reissue.

BACKGROUND OF THE INVENTION

The present invention relates to a digital frequency display device for use in communication equipment. In modern communication equipment such as radio receivers, transmitters and transceivers, a frequency display device is frequently used to digitally display the RF operating frequency. A conventional digital display device for a single conversion type receiver, for example, is constructed so that the output signals of the local oscillator and BFO of the receiver are mixed in a frequency mixer to produce a signal corresponding to the RF operating frequency, and that signal is in turn applied through a frequency counter to a digital display circuit for visual display. A similar approach is used for conventional display devices for double conversion type receivers. In such cases, the outputs of the heterodyne oscillator the VFO and the BFO are mixed to produce a signal corresponding to the RF operating frequency. Problems exist with these types of devices, however, because the display frequency produced through the frequency mixing is the same as that of the signal being received, as a result of which, signal interference can occur in the receiving circuit. Also, with such a system, leakage signals from a transmitter can disrupt proper display operation of the display device. This problem requires strict shielding for the communication equipment, resulting in increased cost.

To avoid these problems, it is proposed that a local oscillator be provided separately from the receiving or transmitting circuit, and that its output be applied to a mixing circuit for mixing with the output of the conventional local oscillator or of the VFO of the communications apparatus. With such a system, the resulting frequency is different or shifted from the RF operating frequency. However, if display is only made for certain of the digits provided by the counter, for example, if the Mhz digits are not displayed, but the KHz digits are displayed, the above-mentioned problem can be overcome.

Also, with conventional systems, sideband switching of the carrier/BFO frequency or band switching generally causes the locally generated frequencies to be changed. These changes make it difficult in conventional systems to provide a correct display of the actual RF operating frequency. Conventionally, a frequency correction knob for the local oscillator or a preset trimmer for the heterodyne oscillator is provided for each frequency band to make the necessary deviation corrections. These approaches, however, lead to complex circuits with poor stability.

SUMMARY OF THE INVENTION

Accordingly, an object of the present invention is to provide a digital frequency display device in which the display frequency may be accurately displayed using simple construction techniques with no need for elaborate shielding.

Another object of the present invention is to provide a digital frequency display device not needing a preset counter to correct the resultant frequency to be displayed.

According to the present invention, a digital frequency display device is provided for digitally displaying the operating frequency of a communication apparatus. A signal having a frequency shifted by a predetermined amount is produced by mixing a reference frequency signal with a signal from the communication apparatus to produce a signal having a frequency having digits partially constituting the desired frequency to be displayed, which signal is counted in a frequency counter and certain of the digits from the counters are displayed.

In another aspect of the present invention, a digital frequency display device is provided for digitally displaying the RF operating frequency of a communication system in which a signal with a frequency shifted by a reference frequency that is produced mixing the reference frequency and a frequency partially constituting the display frequency, is corrected through the reference frequency in frequency counter, wherein the reference frequency coincides with the unit frequency of the most significant digit of a number representative of the display frequency. The counter includes a decimal counter for counting the most significant digit of the display number and for counting 9 in a reset condition, and further includes decimal counters for counting the other remaining digits of the display number and counting 0 in a reset condition.

In still another aspect of the present invention, a digital frequency display device is provided for digitally displaying the RF operating frequency of a communication apparatus in which a signal with a frequency shifted by a reference frequency that is produced by mixing the reference frequency and a frequency partially constituting the display frequency is applied to a frequency counter. A correction of the shifted frequency component is made so that the only digits of the counted frequency actually displayed are those digits lower than the least significant digit of the reference frequency.

Other objects and features of the present invention will be apparent from the following description with reference to the accompanying drawings, in which:

DETAILED DESCRIPTION OF THE PREFERRED EMBODIMENTS

Figure 1:
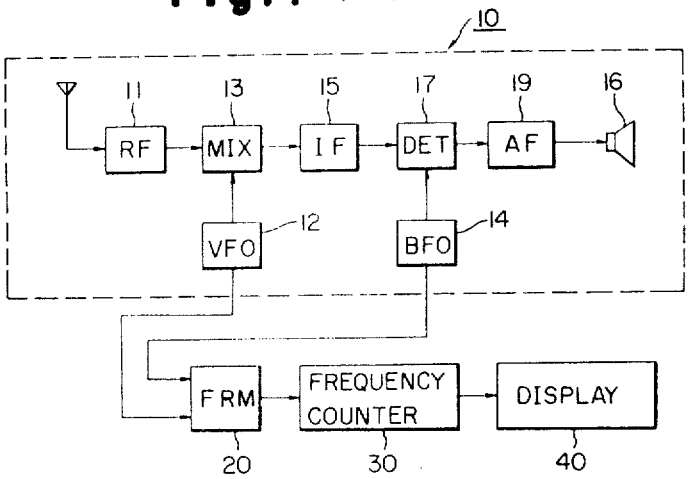
Fig. 1 (PRIOR ART)
FIG. 1 shows a block diagram of a conventional digital frequency display device for a SSB receiver.

Before proceeding with the description of the present invention, an example of a conventional digital frequency display device for a SSB receiver will briefly be described with reference to FIG. 1, for better understanding of the present invention. In the drawings, like reference numerals designate like or similar portions in the several views.

In the figures, the reference numeral 10 designates a typical single sideband receiver; 20, a mixer circuit; 30, a frequency counter circuit; and 40, a digital display circuit. These mixer, counter and display circuits constitute a digital frequency display device. The conventional SSB receiver 10 comprises a radio frequency section 11, a mixer 13, an IF amplifier 15, a detector 17, an audio frequency section 19, a first local oscillator 12, and a second local oscillator 14. The frequency mixing circuit 20 mixes the output frequency of the first local oscillator 12 and that of the second local oscillator 14 to produce a display frequency signal corresponding to the operating frequency signal. The display frequency is counted in the frequency counter 30 and then is applied to the digital display circuit 40 for frequency display. As previously stated, the produced display frequency is the same as the operating frequency and this can interfere with the receiving operation of the receiver.

Figure 2:
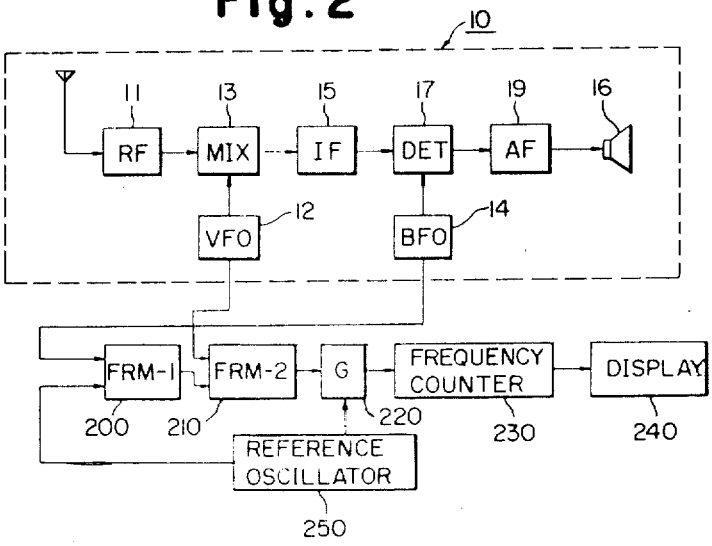
FIG. 2 shows a block diagram of an embodiment of a digital frequency display device according to the present invention.

Referring now to FIG. 2, a first embodiment of a digital frequency display device according to the present invention is shown in which the basic receiver 10 is the same as in FIG. 1. In FIG. 2, reference numeral 200 designates a first frequency mixing circuit; 210, a second frequency mixing circuit; 220, a counter gate; 230, a counter circuit; 240, a digital display circuit; and 250, a reference frequency signal oscillating circuit. The first frequency mixer 200 receives a fixed frequency signal $f_1$ fed from the second local oscillator 14 and a reference frequency signal $f_0$ from the reference signal generator 250. The second frequency mixer 210 receives the mixed frequency signal $f_3$ of the frequency signal $f_1$ and the reference frequency signal $f_0$ and a variable frequency signal $f_2$ fed from the first local oscillator 12. The frequency signals $f_1$ and $f_2$ define the RF operating frequency, and the direct mixing of those frequencies $f_1$ and $f_2$ would cause the same problem as in a conventional display device. For this reason the frequency signal $f_1$ is first mixed with the reference frequency signal $f_0$ to produce the mixed frequency $f_3$, and then the resultant frequency $f_3$ is further mixed with the frequency signal $f_2$ to produce another resultant frequency signal $f_4$. The frequency of the signal $f_4$ is shifted by the reference frequency $f_0$ from the operating frequency.

The resultant signal $f_4$ is applied to the counter circuit 230, through the counter gate 220 which is enabled by a signal derived from the reference signal oscillator 250. The counter circuit 230 includes a preset counter means (not shown) which produces an output when its input reaches the preset number shifted by the reference frequency $f_0$. Therefore, the resultant frequency signal $f_4$ is corrected in the counter circuit 230 to produce a frequency display signal corresponding to the RF operating frequency.

In summary, a frequency partially, constituting the display frequency corresponding to the operating frequency is mixed with a reference frequency to produce a resultant frequency shifted by the reference frequency. This resultant frequency is corrected to eliminate the shifted frequency component in the digital display section by means of a preset counter means.

In this example, the correction may be made not only by the preset counter means but also by any other suitable means. Further, the reference frequency $f_0$ is preferably formed by appropriately multiplying or dividing the frequency generated by the oscillator 250 taking account of the need to avoid spurious radiations within the communication apparatus or in the frequency mixing circuits.

This digital frequency display device eliminating the operating frequency component in the signal processing for frequency display results in several advantages. The frequency display is correctly made with the same precision as in the case of remixing with the operating frequency. At the same time, strict shielding and complex circuit construction are unnecessary. The use of the reference oscillator previously set in the counter eliminates additional expansion of space and increase of cost. And, if the reference frequency is 1 MHz, a specially designed IC is unnecessary for the preset counter.

Figure 3:
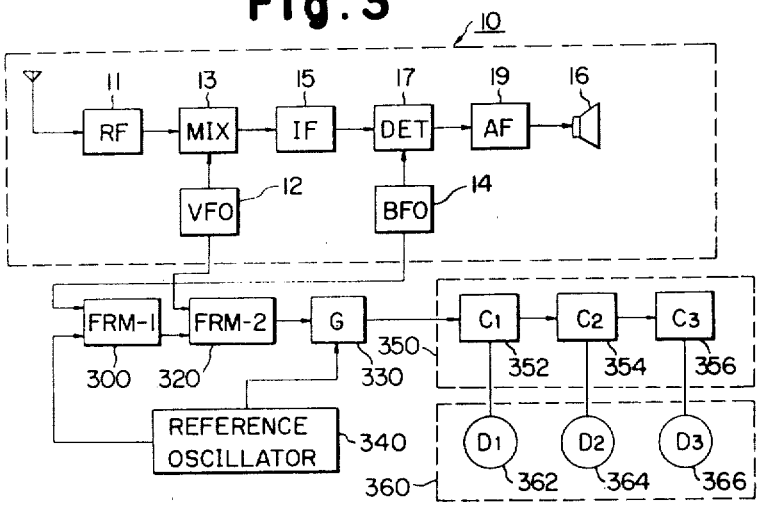
FIG. 3 shows a block diagram of another embodiment of the digital frequency display device according to the present invention.

Turning now to FIG. 3, there is shown a modification of the FIG. 2 embodiment of the digital frequency display device. The same type SSB receiver also is used to which the digital frequency display device is applied. The digital frequency display device in the figure is comprised of a first frequency mixing circuit 300, a second frequency mixing circuit 320, a counter gate 330, a reference frequency oscillator 340, a frequency counter 350 and a digital display section 360. The counter 350 includes three cascaded decimal counters: a decimal counter 352 labeled C1, another decimal counter 354 labeled C2, and a further decimal counter 356 labeled C3. The decimal counter 352 counts the least significant digit of the frequency to be displayed and is set to count "0" in the reset condition. The decimal counter 354 counts the second digit of the display frequency and is resettable to count "0". The decimal counter 356 counts the most significant digit of the display frequency and is set to count "9" when it is reset. In this example, only three digits of display frequency are displayed. The digital display section 360 includes a first display element 362 labeled D1 connected with the decimal counter 352 for displaying the least significant digit of the display frequency, a second display element coupled with the decimal counter 354 for displaying the second digit of the display frequency, and a third display element connected to the decimal counter 356 for displaying the most significant digit. Any suitable display means may be used for those display elements. The second and third display elements labeled D2 and D3 are designated by reference numerals 364 and 366.

The BFO 14 of the SSB receiver 10 and the reference frequency oscillator 340 are connected to the input of the frequency mixing circuit 300. The output of the frequency mixing circuit 320 and the output of the VFO 12 are connected with the input of the other frequency mixing circuit 320. The counter gate 330 is connected with the output of the frequency mixing circuit 320 and to a signal derived from the reference frequency oscillator 340. The gating operation of the gate 330 is controlled by signal from the reference frequency oscillator 340.

Assume now that $f_1$ is used for designating the operating frequency, or the receiving frequency, of the SSB receiver 10, $f_2$ for the oscillating frequency of the BFO 14 of the SSB receiver 10, $f_3$ for the oscillating frequency of the VFO 12, 1 MHz is the reference frequency, and the 4.65 MHz is the operating frequency. The resultant frequency $f_4$ of the frequency mixing circuit 320 is expressed $$f_4=(f_2\pm f_3)\pm 1=f_1\pm 1 \qquad (1)$$

The resultant frequency $f_4$ is applied to a filter (not shown) where it is filtered out to be the operating frequency 4.65 MHz plus the reference frequency 1 MHz, i.e. 5.65 MHz. The frequency of 5.65 MHz is then fed to the counter 350. Upon receipt of the frequency 5.65 MHz, the decimal counters C1 and C2 initiate their counting operation from the reset condition "0", with result that the least significant digit displaying element D1 displays 5 representing 50 KHz, and the second displaying element D2 displays 6 for 600 KHz. The decimal counter C3 for the most significant digit starts to count from the reset condition "9", thereby causing the display element D3 to display the numeral 4 which is smaller than the counting number 5, by one. In this manner, the operating frequency 4.65 MHz is correctly displayed in the display section.

From the foregoing description, it will be seen that this example may correct the frequency shift without additional special components such as a preset counter means used in the FIG. 2 embodiment.

A decimal counter which is set to count "9" when it is reset is commercially available, as is a decimal counter which is set to count in the reset condition.

It will be further understood that this example is applicable for cases in which all digits or only a part of the digits of the display frequency are to be displayed.

Figure 4:
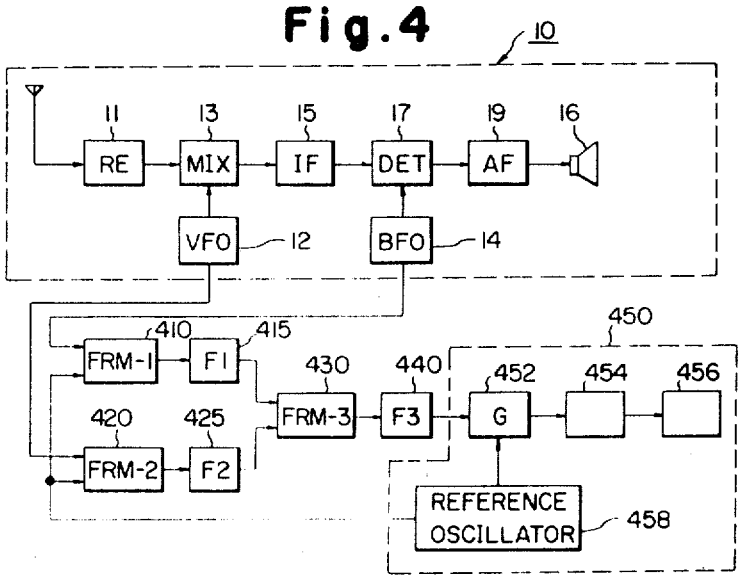
FIG. 4 shows a block diagram of another embodiment of the digital frequency display device according to the present invention.

A further embodiment of the present invention is shown in FIG. 4 which includes the same basic SSB receiver 10. The reference numeral 410 designates a first frequency mixing circuit; 415, a first filter; 420, a second frequency mixing circuit; 425, a second filter; 430, a third frequency mixing circuit; 440, a third filter; and 450, a display section. The display section 450 is comprised of a counter gate designated by reference numeral 452, a frequency counter 454, a display circuit 456 and a reference frequency oscillator 458. The first frequency mixing circuit 410 is coupled at the input with the BFO 14 of the SSB receiver 10 and the reference frequency oscillator 458. The second frequency mixing circuit 420 is coupled at the input with the VFO 12 and the reference frequency oscillator 458. The output of the first frequency mixing circuit 410 is coupled with the third frequency mixing circuit 430 through the first filter 415. The output of the second frequency mixing circuit 420 also is coupled with the same third frequency mixing circuit 430 through the second filter 425. The third frequency mixing circuit 430 is connected to the display section 450 through the filter 440. The counter gate 452 is enabled by the output of the reference frequency oscillator 458 to allow passing of the output of the filter 440 to the frequency counter 454.

Assume now that the operating frequency of the SSB receiver is expressed by $f_1$, the oscillation frequency of the BFO 14 by $f_2$, that of the VFO by $f_3$, and the reference frequency by $f_0$. The resultant frequency $f_4$ outputted from the first frequency mixing circuit 410 is given $$f_4 = f_2 \pm f_0 \quad (1)$$

The resultant frequency $f_5$ fed from the second frequency mixing circuit 420 is given $$f_5 = f_3 \pm f_0 \quad (2)$$

The resultant frequency $f_4$ of the equation (1) is filtered in the filter circuit 415 and either $f_2+f_0$ or $f_2-f_0$ selected to be applied to the third frequency mixing circuit 430. Similarly, the resultant frequency $f_5$ of the equation (2) is filtered in the filter 425 and either $f_3+f_0$ or $f_3-f_0$ selected to be applied to the third frequency mixing circuit 430. Accordingly, the resultant frequency $f_6$ of the third frequency mixing circuit 430 is given $$f_6 = (f_2 \pm f_3) \pm 2f_0 = f_1 \pm 2f_0 \quad (3)$$

As seen from equation (3), the resultant frequency $f_6$ of the third frequency mixing circuit 430 includes double reference frequencies in addition to the operating frequency. Either of the frequencies $f_1+2f_0$ and $f_1-2f_0$ is selected in the third filter 440 and then is applied to the display section 450. The frequency component of $2f_0$ fed from the filter 440 through the counter gate 452 is eliminated in the frequency counter 454. As in the FIG. 2 embodiment, the frequency counter 454 includes a preset counter (not shown) for correcting the frequency shift of $2f_0$. In this way, the display circuit 456 correctly displays the operating frequency.

As previously described the RF operating frequency is not actually used in the signal processing necessary for frequency display so that interference is eliminated, thus allowing a simple circuit construction without strict shielding.

Although the reference frequency oscillator in the frequency counter is used in the FIG. 4 embodiment, an independent reference frequency oscillator could also be used. This is also true for the FIG. 2 embodiment. Similarly, if the basic approach of the FIG. 3 embodiment is applied to embodiment of FIG. 4, the preset counter for the $2f_0$ frequency correction could be eliminated. More specifically, the first non-zero least significant digit of the frequency $2f_0$ is selected to be higher than the most significant digit to be displayed for the RF operating frequency.

Figure 5:
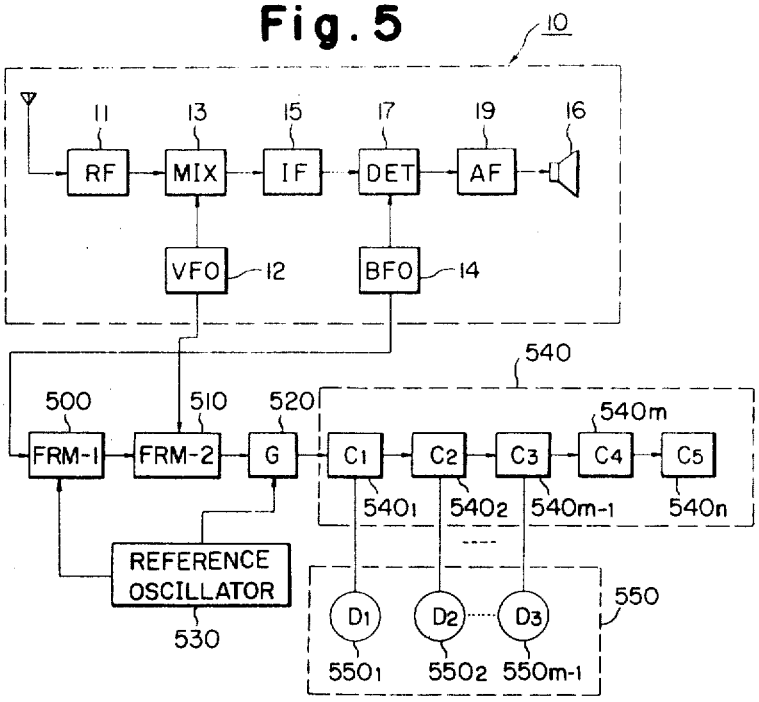
FIG. 5 shows a block diagram of still another embodiment of the digital frequency display device according to the present invention.

A still further embodiment will now be described with reference to FIG. 5 which includes the same basic SSB receiver 10. In FIG. 5a, a first frequency mixing circuit 500 is coupled at the input with the BFO 14 of the SSB receiver 10 and a reference frequency oscillator 530. A second frequency mixing circuit 510 is connected at the input to the output of the first frequency mixing circuit 500 and the VFO 12. The output of the second frequency mixing circuit 510 is connected to a frequency counter 540 through a counter gate 520 which is enabled by the output of the reference frequency oscillator 530. The frequency counter 540 is comprised of n decimal counters cascade-connected $540_1$, $540_2$ . . . $540_{m-1}$, $540_m$ . . . $540_n$. The frequency counter 540 is connected with a display section 550 comprising display elements $550_1$, $550_2$ . . . $550_{m-1}$. The respective display elements $550_1$, $550_2$ . . . $550_{m-1}$ are correspondingly connected to the decimal counters $540_1$, $540_2$ . . . $540_{m-1}$ of the frequency counter 540, permitting m-1 digits representative of the RF operating frequency to be displayed.

With designation of $f_1$ for the RF operating frequency of the SSB receiver 10, $f_2$ for the BFO frequency, $f_3$ for the VFO frequency, and $f_0$ for the reference frequency, the first frequency mixing circuit 500 provides a signal with the resultant frequency $(f_2 \pm f_0)$. The resultant frequency $f_4$ from the second frequency mixing circuit 510 is $$f_4 = (f_2 \pm f_3) \pm f_0 = f_1 \pm f_0 \quad (5)$$

Either of $f_1+f_0$ or $f_1-f_0$ of the resultant frequency $f_4$ is selected by a filter (not shown) connected to the output of the second frequency mixing circuit 510. The selected frequency is applied to the frequency counter 540 through the counter gate 520. Although the frequency counter 540 is capable of counting the n digits of the operating frequency, the display section is set to display only m digits of the frequency. The reason for this is that if the first non-zero significant digit of the frequency $f_0$ corresponds to the m+1 digit position (which is not displayed), then, the frequency display will be correctly representative of the actual RF operating frequency.

For better understanding of this example, the operation will be described by using actual numbers for the various frequencies. Assume the operating frequency $f_1$ is 4.655 MHz, the reference frequency $f_0$ is 10.000 MHz, and, the resultant frequency $f_4$ to be applied to the frequency counter 540 is 14,655 MHz. The frequency counter 540 counts up to five digits with the result that the decimal counters $\mathbf{540_1}$ to $\mathbf{540_5}$ output 5, 5, 6, 4, and 1, respectively. As previously mentioned, the output of the counter counting the digit corresponding to the least significant one except of 0 of the reference frequency $f_0$ of 10,000 KHz, i.e. the decimal counter $\mathbf{540_5}$ counting 10 MHz order, is not applied to the display section. Therefor, only the outputs of the decimal counters $\mathbf{540_1}$ to $\mathbf{540_4}$ counting the digits lower than 10 MHz are applied to the display elements $\mathbf{550_1}$ to $\mathbf{550_4}$, respectively, so that the frequency display of 4,655 MHz is correctly representative of the RF operating frequency.

Another example will be given in which 15,000 MHz is used for the reference frequency, the operating frequency is 4,655 MHz and the resultant frequency $f_4$ is 19,655 MHz. The frequency counter 540 counts five digits, in response to the resultant frequency, and the decimal counters $\mathbf{540_1}$ to $\mathbf{540_5}$ produce outputs 5, 5, 6, 9, and 1, respectively. The digits of the resultant frequency $f_4$ 19,655 MHz to the frequency counter 540 which correspond to be the ones higher than the least significant digit except of 0 of the reference frequency $f_0$ 15,000 MHz, are 19 MHz and the outputs of the decimal counters counting the 19 MHz are not applied to the display section 550. Accordingly, the frequency to be displayed in the display section is 655 KHz which is correctly representative of the actual RF operating frequency.

Various other modifications of the disclosed embodiments will become apparent to persons skilled in the art without departing from the spirit and scope of the invention as defined by the appended claims.

What is claimed is:

1. A digital frequency display device for displaying digits representative of the operating frequency of a communication apparatus comprising:

a reference frequency oscillator;

a first frequency mixer for mixing the output frequencies of a first oscillator of the communication apparatus and of said reference frequency oscillator;

a second frequency mixer for mixing the output frequency of a second oscillator of the communication apparatus and the output frequency from said first frequency mixer to produce a frequency corresponding to the frequency to be displayed but shifted by the reference frequency;

a frequency counter including correcting means for eliminating said shifted frequency component for counting the output frequency from said second frequency mixer; and display means connected to said frequency counter for displaying digits representative of the operating frequency.

2. A digital frequency display device according to claim 1 wherein the reference frequency is selected to have a "1" digit in the digit position of a decimal number representing the reference frequency corresponding to the position of the most significant digit of the displayed digits representing the operating frequency, and wherein said counter includes a plurality of cascaded decimal counters wherein the decimal counter corresponding to the most significant digit of the displayed digits is set to count "9" when reset and wherein the other decimal counters are set to count "0" when reset.

3. A digital frequency display device according to claim 1 wherein said correcting means includes means for causing said display means to only display digits from said counter corresponding to digit positions lower in significance than the digit position of the first non-zero digit of the decimal number representing the reference frequency.

4. A digital frequency display device according to claim 1 wherein said correcting means includes a preset counter.

5. A digital frequency display device according to claim 1 wherein the first oscillator of the communications apparatus is a BFO oscillator and wherein the second oscillator of the communications apparatus is a VFO oscillator.

6. A digital frequency display device for displaying digits representative of the operating frequency of a communication apparatus comprising:

a reference frequency oscillator;

a first frequency mixer for mixing the output frequency of a first oscillator of the communication apparatus and the reference frequency of said reference frequency oscillator;

a second frequency mixer for mixing the output frequency of a second oscillator of the communication apparatus and the reference frequency of said reference frequency oscillator;

a first filter for filtering the resultant frequency from said first frequency mixer;

a second filter for filtering the resultant frequency from said second frequency mixer;

a third frequency mixer for mixing said resultant frequencies from said first and second filters to produce a resultant frequency shifted by two times the reference frequency;

a third filter for filtering said resultant frequency from said third frequency mixer;

a frequency counter including correcting means for eliminating said shifted frequency component for counting said resultant frequency from said third filter; and display means connected to said frequency counter for displaying digits representative of the operating frequency.

7. A digital frequency display device according to claim 6 wherein said correcting means includes a preset counter.

8. A digital frequency display device for displaying digits representative of the operating frequency of a communication apparatus comprising:

a reference frequency oscillator;

a first frequency mixer for mixing the output frequency of a first oscillator of the communication apparatus and the reference frequency of said reference frequency oscillator;

a second frequency mixer for mixing the output frequency of a second oscillator of the communication apparatus and the reference frequency of said reference frequency oscillator;

a third frequency mixer for mixing signals from said first and second mixers to produce a resultant frequency shifted by two times the reference frequency;

a frequency counter including correcting means for eliminating said shifted frequency component for counting said resultant frequency from said third mixer; and display means connected to said frequency counter for displaying digits representative of the operating frequency.

9. A digital frequency display device according to claim 8 wherein said correcting means includes a preset counter.

* * * * *